(12) United States Patent
Tsai et al.

(10) Patent No.: US 6,328,808 B1
(45) Date of Patent: Dec. 11, 2001

(54) APPARATUS AND METHOD FOR ALIGNING AND CONTROLLING EDGE DEPOSITION ON A SUBSTRATE

(75) Inventors: Kenneth Tsai, Redwood City; Joseph Yudovsky, Palo Alto; Steve Ghanayem, Sunnyvale; Ken K. Lai, Santa Clara; Patricia Liu, Saratoga, all of CA (US); Toshiyuki Nakagawa, Narita (JP); Maitreyee Mahajani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/543,393

(22) Filed: Apr. 5, 2000

Related U.S. Application Data (63) Continuation of application No. 08/914,522, filed on Aug. 19, 1997, now Pat. No. 6,186,092.

(51) Int. Cl.[7] .................................................. C23C 16/00
(52) U.S. Cl. ............................ 118/729; 118/728; 118/500
(58) Field of Search .................................... 118/728, 729, 118/500

(56) References Cited

U.S. PATENT DOCUMENTS

| | | | |
|---|---|---|---|
| 3,982,979 | 9/1976 | Hentz et al. ........................ | 156/73.6 |
| 4,503,091 | 3/1985 | Elliott et al. ........................ | 427/180 |
| 4,978,412 | 12/1990 | Aoki et al. ........................ | 156/345 |
| 5,221,642 | 6/1993 | Burns ................................ | 437/207 |
| 5,304,248 | * 4/1994 | Cheng .............................. | 118/728 |
| 5,326,725 | 7/1994 | Sherstinsky et al. ............... | 437/225 |
| 5,516,367 | 5/1996 | Lei et al. ........................... | 118/725 |
| 5,556,476 | 9/1996 | Lei et al. ........................... | 118/728 |

* cited by examiner

Primary Examiner—Richard Bueker
(74) Attorney, Agent, or Firm—Moser, Patterson & Sheridan LLP

(57) ABSTRACT

An alignment mechanism for aligning a substrate on a support member in a process chamber includes a set of guide pins extending from the upper surface of the support member equally spaced about the periphery thereof and spaced to receive a substrate therebetween and align a shadow ring thereover. The inner surfaces of the guide pins are slanted outwardly to form an inverted funnel for receiving and aligning the substrate on the support member. An annular gas groove in the upper surface of the support member provides communication for a supply of purge gas and directs the gas about the peripheral edge of the substrate. The guide pins which extend partially over the gas groove include slots therein that provide fluid communication through the guide pins from the gas groove to the peripheral edge of the substrate. The guide pins also mate with alignment bores formed in the shadow ring so that, as the support member moves into the processing position, the inner surfaces of the guide pins abut abutment surfaces in the alignment bores and align the shadow ring on the support member and over the substrate. A hanger member supports and aligns the shadow ring between processing of each substrate.

16 Claims, 7 Drawing Sheets

APPARATUS AND METHOD FOR ALIGNING AND CONTROLLING EDGE DEPOSITION ON A SUBSTRATE

This is a continuation of application Ser. No. 08/914,522 filed on Aug. 19, 1997 now U.S. Pat. No. 6,186,092.

BACKGROUND OF THE INVENTION

1. Field of the Invention

The present invention relates to the field of semiconductor substrate processing equipment. More particularly, the present invention relates to an apparatus and method for aligning a substrate and a shield member on a support member.

2. Background of the Related Art

In the fabrication of integrated circuits, equipment has been developed to automate substrate processing by performing several sequences of processing steps without removing the substrate from a vacuum environment, thereby reducing transfer times and contamination of substrates. Such a system has been disclosed for example by Maydan et al., U.S. Pat. No. 4,951,601, in which a plurality of processing chambers are connected to a transfer chamber. A robot in a central transfer chamber passes substrates through slit valves in the various connected processing chambers and retrieves them after processing in the chambers is complete.

The processing steps carried out in the vacuum chambers typically require the deposition or etching of multiple metal, dielectric and semiconductor film layers on the surface of a substrate. Examples of such processes include chemical vapor deposition (CVD), physical vapor deposition (PVD), and etching processes. Although the present invention pertains primarily to CVD processes, it may have application to other processes as well.

CVD vacuum chambers are employed to deposit thin films on semiconductor substrates. Typically, a precursor gas is charged to a vacuum chamber through a gas manifold plate situated above a substrate. The substrate is heated to process temperatures. The precursor gas reacts. on the heated substrate surface to deposit a thin layer of material thereon. In a typical process chamber, a support member on which a substrate is mounted during processing is movable vertically in the chamber by means of a vertically movable support member. A plurality of support fingers are also vertically movable by an elevator and extend through the support member to facilitate transfer of the substrate from a robot blade onto the support member.

A number of problems associated with the deposition of the film of material on the substrate are at least partially attributable to improper alignment and shielding of the substrate. One such related problem occurs when the material deposits on the edge and back side surfaces of the substrate. Typically, these edge and back side surfaces are rougher than the highly polished top surface and are not coated with the adhesive layer covering the top surface. Therefore, material deposited on these surfaces tends to flake off the substrate and create particles. Generation of particles within the chamber is to be avoided as the particles may contaminate the substrates being processed and, thereby reduce the yield of good devices, and may damage the chamber components. Another problem occurs when the material deposits on the back side of the substrate causing the substrate to stick to the support member. Sticking may lead to particle generation when the deposited material adhering the substrate to the support member is broken away during removal of the substrate from the chamber An additional concern relating to alignment and shielding pertains to the industry demands for film uniformity and edge exclusion. As the desire for greater throughput and efficiency has increased, the standards governing the placement and thickness of the deposited film at the substrate edge have continually become more stringent. Ideally, the deposited film has a uniform thickness across the entire area of the substrate with the edges of the film dropping off rapidly so that the zone of exclusion has little or no deposition thereon. Further, there is ideally no deposition on the beveled edges of the substrate. Industry practice has moved toward this ideal goal so that the current industry standards demand no film deposition on the beveled edge of the substrate and a film thickness at a point 3 mm from the edge of the substrate that is 90 percent or more of the film thickness at the center of the substrate with a thickness uniformity of ±5 percent, excluding the area within 5 mm from the substrate edge. To achieve these requirements, the substrate must be properly aligned on the support member with the edges properly shielded.

In an effort to overcome the above mentioned problems, various devices and methods have been developed to shield the edge and back side surfaces of the substrate and to provide proper alignment of the substrate relative to the support member and other chamber components. Included among these devices are shadow rings, shielding purge gases and their delivery systems, and alignment mechanisms, such as guide pins. Shadow rings and purge gases are used to prevent deposition of the material on the edge and back side surfaces of the substrate; whereas, guide pins are used to align the substrate on the support member.

Shadow rings cover the periphery of the substrate during deposition to mask the edge of the substrate, thereby preventing the deposition gases from reaching the edge and back side surfaces of the substrate. To obtain the required edge exclusion, the substrate and the shadow ring must be properly aligned relative to one another and relative to the support member. Typically, the shadow ring is supported in the chamber by an outer support ring above the support member during substrate transfer and is lifted by the support member when the support member lifts the substrate into the upper portion of the chamber where the deposition of the film occurs. Therefore, because the shadow ring is removed from the support member during each process cycle, the shadow ring may become misaligned relative to the support member and a properly aligned substrate on the support member. Accordingly, an alignment mechanism for ensuring alignment of the shadow ring to the support member and the substrate is needed.

The shielding purge gas is directed about the periphery of the substrate and exerts a positive pressure that reduces the chance that processing gas will reach the edge and back side surfaces of the substrate. To provide the purge gas to the full periphery of the substrate, the support member typically includes an annular gas groove that has an inner diameter that is less than the outer diameter of the substrate and an outer diameter that is greater than the outer diameter of the substrate so that a properly aligned substrate resting on the upper surface of the substrate overhangs the gas groove about the full periphery of the substrate. It has been found that the combination of a shadow ring and a purge gas further enhance edge performance.

Although a number of alignment mechanisms are presently in use and many of the prior alignment mechanisms are useful in connection with the present invention, the following description focuses primarily on an alignment mechanism using guide pins. An alignment mechanism using guide pins employs a plurality of guide pins extending upwardly from the upper surface of the support member. The guide pins are equally spaced about the periphery of the support member and have an inner angled surface that flares outwardly toward their upper ends. The guide pins are sufficiently spaced so that they can receive a substrate therebetween. The guide pins act as a funnel that centers the substrate on the support member as the support member moves to receive the substrate thereon. So that the substrate is properly positioned with its full peripheral edge overhanging the gas groove, the guide pins extend from the outer periphery of the gas groove and partially overhang the gas groove. In this way, the lower end of the funnel defined by the plurality of guide pins has a diameter that is intermediate the inner and outer diameters of the gas groove and that is larger than the outer diameter of the substrate. Accordingly, as the support member moves upwardly to receive the substrate thereon, the angled walls of the guide pins force the substrate laterally into alignment and so that it overhangs the gas groove about the full periphery of the substrate.

However, the guide pins used to force the substrate laterally into alignment necessarily abut the edge of the substrate to obtain this alignment and remain in abutment therewith when the substrate rests upon the upper surface of the support member. The purge gas flowing from the gas groove cannot flow between the guide pins, which are attached to the upper surface of the support member, when the substrate and guide pins are in abutment with one another. Therefore, the contact between the guide pins and the substrate prevents the purge gas from shielding the edge of the substrate proximal the guide pins in abutment with the substrate and permits deposition of the film in the vicinity of the abutting guide pins. Thus, the blockage caused by contact between the guide pins and the substrate edge allows the film to deposit in the exclusionary zone and on the beveled edge near the guide pins creating a danger of flaking and particle generation and preventing compliance with the industry requirements for edge exclusion.

Thus, despite the use of all of the prior art features, there remains a need for increasing proper alignment between a substrate, a support member, and a shadow ring. Additionally, there is a need for an alignment mechanism that does not adversely affect the flow of purge gas at the substrate edge.

SUMMARY OF THE INVENTION

The present invention generally provides an alignment apparatus for aligning both a substrate and a shadow ring relative to a support member in a process chamber. The alignment apparatus is preferably adapted so that it does not substantially block the flow of purge gas to the edge of the substrate, thereby preventing unwanted deposition of material on the exclusionary zone and the beveled edges of the substrate in the proximity of the alignment apparatus. More particularly, the invention provides a set of guide pins disposed on the upper surface of the support member that each have a slanted inner surface. Together the slanted surfaces form an inverted funnel that aligns a substrate as it is received in the guide pins and placed on the upper surface of the support member. Additionally the guide pins mate with corresponding alignment bores formed in the shadow ring to align the shadow ring as the support member is moved through the shadow ring and contacts the shadow ring. The guide pins have communication passageways disposed therethrough that provide fluid communication of purge gas from a gas supply to a predetermined position at the peripheral edge of the substrate. A set of hanger pins aligns the shadow ring in the chamber between each processing cycle when the support member is lowered in the chamber for substrate exchange. Additionally, the shape of the shadow ring combined with optimization of the purge gas flow rate and the relative positioning of the components provides a system that meets the industry standards previously set forth.

In general, the process chamber houses a support member that is movable vertically between a first lowered position and a second, raised position. The support member is adapted to receive a substrate thereon and move the substrate into the second position where the process step is performed on the substrate. Lifting fingers extend through finger apertures in the support member and facilitate transfer of the substrate between the upper surface of the support member and a robot handling blade. Purge gas openings provide fluid communication of a purge gas from a purge gas supply to a gas channel formed in the upper surface of the support member. The gas channel is in the form of an annular gas groove and defines an interior region and an exterior region of the upper surface of the support member. A plurality of guide pins attached to the exterior region are spaced about the periphery of the gas channel and are at least partially disposed over the gas channel. The guide pins have inner surfaces that together define a circumferential boundary sized and adapted to receive a substrate therein. The inner surfaces of the guide pins are slanted outward from the interior region to define a funnel for receiving and aligning a substrate on the upper surface of the support member.

One aspect of the invention provides a shadow ring that is vertically, slidably supported on a hanger member. A motion actuator attached to the support member is adapted to move the support member vertically relative to the hanger member so that, in a first position of the support member, the shadow ring is supported by the hanger member and, in a second position of the support member, the shadow ring covers an outer peripheral portion of the substrate and is supported on the support member. The hanger member is adapted so that, as the support member moves from the second position to the first position lowering the shadow ring onto the hanger member, the hanger member aligns the shadow ring to a predetermined position. Generally, the hanger member is a set of resting pins attached to a outer support ring disposed in the process chamber and a set of mating support bores extending vertically through the shadow ring. The resting pins have at least one frustoconical portion adapted so that the diameter of the support bore is intermediate in size to the smallest and largest diameters of the frustoconical portion. Therefore, when the shadow ring is lowered onto the resting pins between each processing cycle, the frustoconical portions force the shadow ring into the same position each time.

The shadow ring also defines a set of abutment surfaces positioned and adapted to mate with and abut with the guide pins so that, as the support member moves from the first position to the second position, the abutment surfaces mate with and abut the guide pins and align the shadow ring relative to the support member and to the substrate. Thus, the guide pins align both the substrate and the shadow ring. Preferably, the shadow ring includes a plurality of alignment bores extending therethrough each of which defines one of the abutment surface. The abutment surfaces are slanted so that they mate with and abut the slanted inner surfaces of the guide pins.

In another aspect of the present invention each of the guide pins include a communication passageway that extends therethrough and provides fluid communication from below the guide pins to the edge of the substrate. Preferably, the communication passageway is a slot formed in and defined by the guide pin that is open to the bottom of the guide pin and the inner surface of the guide pin. Because the guide pin overhangs the gas channel, the slot is in fluid communication with the gas channel. The height of the slot in the inner surface is greater than the height of a substrate resting on the upper surface of the support member so that the slot supplies purge gas to the edge of the substrate and above the substrate between the shadow ring and the upper surface of the substrate.

Accordingly, in operation as the support member moves from the first position to the second position, the slanted surfaces of the guide pins force the substrate laterally into alignment on the upper surface of the support member which lifts the substrate from the lifting fingers. Then, as the support member lifts the shadow ring from the resting pins of the hanger member, the guide pins mate with the slanted abutment surfaces of the alignment bores extending through the shadow ring forcing the shadow ring into alignment relative to the support member and the substrate. During processing, a purge gas is supplied to the edge of the substrate via a gas channel formed in the support member. Communication passageways in the guide pins allow the purge gas to flow through the guide pins and thereby prevent deposition on the zone of exclusion in the proximity of the guide pins. After processing, the support member is lowered from the second position to the first position. During this downward travel, the shadow ring engages the frustoconical portion of the resting pins which force the shadow ring into a predetermined reset position. The lifting fingers lift the substrate from the upper surface of the support member and a robot blade removes the substrate from the chamber.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally provides an alignment apparatus 20 for aligning both a substrate 14 and a shadow ring 70 relative to a support member 30 in a process chamber 12. The alignment apparatus is preferably adapted so that it does not substantially block the flow of purge gas to the edge 18 of the substrate 14, thereby preventing unwanted deposition of material on the exclusionary zone and the beveled edges of the substrate 14 in the proximity of the alignment apparatus. More particularly, the invention provides a set of guide pins 50 disposed on the upper surface 32 of the support member 30 that each have a slanted inner surface 52. Together the slanted surfaces form an inverted funnel that aligns a substrate 14 as it is received in the guide pins 50 and placed on the upper surface 32 of the support member 30. Additionally the guide pins 50 mate with corresponding alignment bores 72 formed in the shadow ring 70 to align the shadow ring 70 as the support member is moved through the shadow ring 70 and contacts the shadow ring 70. The guide pins 50 have communication passageways 56 disposed therethrough that provide fluid communication of purge gas from a gas supply (not shown) to a predetermined position at the peripheral edge 18 of the substrate 14. A set of hanger pins 90 aligns the shadow ring 70 in the chamber 12 between each processing cycle when the support member 30 is lowered in the process chamber 12 for substrate exchange. This alignment apparatus 20 is particularly useful in CVD processing chambers and the following description refers primarily to these CVD processes to facilitate description and understanding. However, it is understood that the present invention may have application to other processes, process chambers, and apparatuses, such as PVD and etch processes, and is, therefore, not limited to the precise form described.

Figure 1:
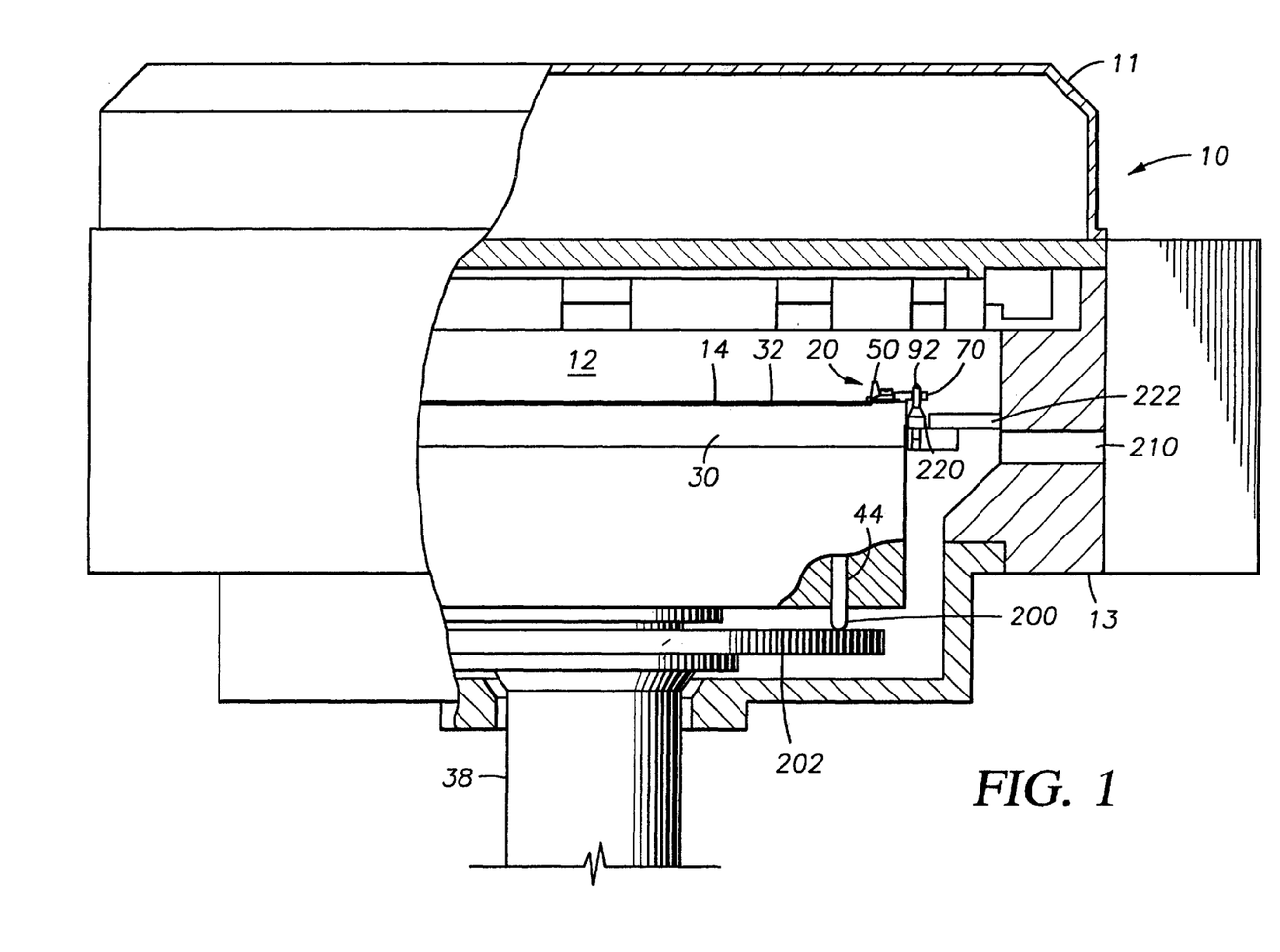
FIG. 1 is a partial cross sectional, side elevational view of the process chamber.

FIG. 1 shows a typical process chamber 12 defined by an outer body 13. The chamber 12 may be part of a vacuum processing system having a plurality of process chambers 12 connected to a central transfer chamber. The process chamber 12 houses a support member 30 that may take the form of a pedestal or susceptor mounted on a generally vertically oriented shaft 38. The support member 30 serves to support a substrate 14 on its flat upper surface 32. The support member 14 also includes four finger apertures 44 each having a lift finger 200 disposed therein for supporting a substrate 14 during substrate exchange with a robot. The support member 30 generally includes four such lifting fingers 200 to lift the substrate 14 clear of the upper surface 32 of the support member 30 after processing. This removal of the substrate 14 is achieved by means of a conventional process chamber robot arm (not shown) which enters the process chamber 12 through a slit valve opening 210. The same robot arm is also used to insert the substrates 14 into the process chamber 12. The lifting fingers 200 are movable vertically under action of a secondary motion actuator 202 of which only the upper portion is shown in FIG. 1. Typically, the support member 30 comprises a block of metal, e.g., aluminum, that has a single coil resistance heater embedded therein. However, the support member 30 may be formed of other materials such as ceramic. In order to provide uniform heating of the support member 30 and to uniformly heat the substrate 14 mounted thereon, the coil must be in contact with the bulk of the support member 30 on all sides. Alternatively, the support member may include cooling channels to cool a substrate. A motion actuator (not shown) interconnected to the shaft 38 of the support member 30 is adapted to move the support member 30 vertically within the process chamber 12 alternatively between a first, lowered position and a second, raised position where a process step is performed.

Figure 2:
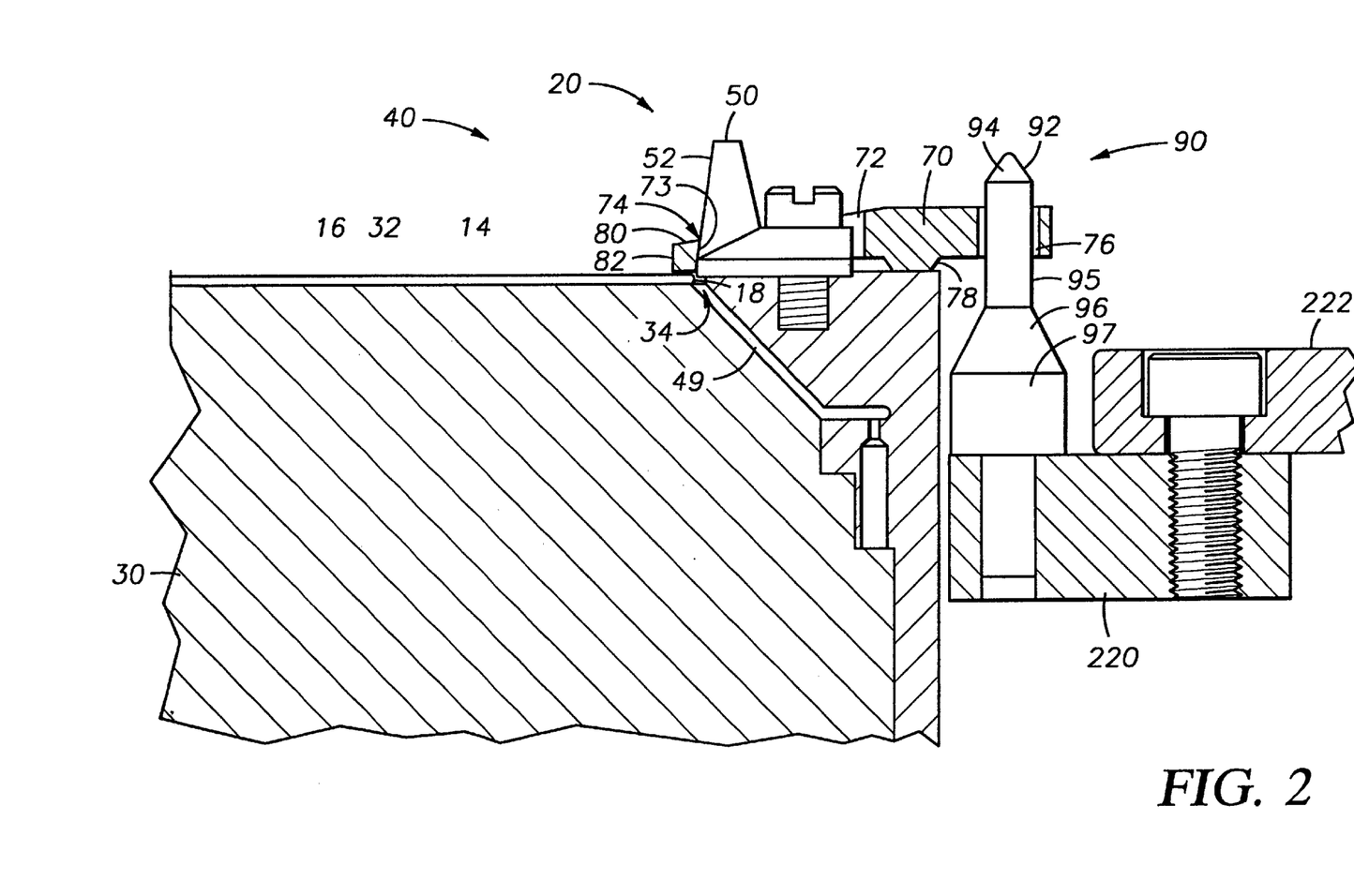
FIG. 2 is a cross sectional, side elevational view of the alignment mechanism.

FIG. 2 is a cross sectional, side elevational view of the support member 30 having a substrate 14 thereon, the shadow ring 70, the alignment apparatus 20, and the hanger member 90. The support member 30 includes a plurality of purge gas openings 49 therein that provide fluid communication of a purge gas from a gas supply (not shown) to a gas channel 34 formed in the upper surface 32 of the support member 30. Preferably, the gas channel 34 is in the form of a continuous gas groove that delivers a purge gas to the full periphery of the substrate 14. The annular gas groove has an inner diameter that is at least equal to the outer diameter of the substrate 14 and is sufficiently wide so that a substrate 14 supported on the upper surface 32 partially overhangs the gas channel 34 about its fall periphery. The gas channel 34 directs the purge gas against the full peripheral edge 18 of the substrate 14, thereby substantially inhibiting the process gas from coming in contact with the substrate edge and the exclusionary zone. The gas channel 34 defines an interior region 40 and an exterior region 42 surrounding the interior region 40 of the upper surface 32 of the support member 30. The interior region 40 is substantially coextensive with the shape and size of the substrate 14.

A plurality of guide pins 50 are attached to the exterior region 42 of the upper surface 32 of the support member 30 and extend partially over the gas channel 34. Each guide pin 50 has a slanted inner surface 52 that is tilted relative to the upper surface 32 of the support member 30 in a direction away from the interior region 40. Thus, the upper end of the inner surface 52 of the guide pin 50 is horizontally offset from the interior region 40 more than the lower end of the inner surface 52. The inner surface 52 is relatively smooth and flat and is adapted for sliding receipt of the edge 18 of the substrate 14.

As shown in FIG. 2, when the support member 30 is in the second, raised position, the shadow ring 70 housed within the process chamber 12 shields a portion of the substrate 14 to prevent deposition of the material thereon. A shield portion 80 of the shadow ring 70 defines a central aperture 82 therethrough which defines a usable substrate area. The diameter of the aperture 82 may be slightly less than the outer diameter of the substrate 14 to form a small (preferably less than 1.5 mm) exclusionary zone around the edge of the substrate 14. When in the raised position, the shield portion 80 of the shadow ring 70 is maintained above the substrate 14 using at least one spacer support 78 that is coupled to the bottom surface of the shadow ring 70. Preferably, the spacer support 78 is an annular raised portion extending from the lower surface of the shadow ring 70 and has a diameter that is smaller than the outer diameter of the of the support member 30. The spacer support 78 contacts the support member 30 when the shadow ring 70 is supported by the support member 30. The spacer support 78 is sufficiently thick and the overall design of the shadow ring 70 is such that they maintain the mask area of the shadow ring 70 a predetermined distance, preferably about 0.3 mnm, above the upper surface 16 of the substrate 14 when the support member 30 is supported on the support member 30. Maintaining the shadow ring 70 above the upper surface 16 of the substrate 14 is necessary to allow the flow of purge gas from the gas channel 34 around the edge 18 of the substrate 14 and between the shadow ring 70 and the substrate 14.

The shadow ring 70 is preferably supported, when the support member 30 is in the lowered, first position, by an outer support ring 220 that is, in turn, supported by a conventional pumping plate 222 disposed in the process chamber 12. The shadow ring 70 is slidably supported by a hanger member 90 attached to the outer supporting ring 220. Preferably, the hanger member 90 comprises at least one, but preferably three, resting pins 92 that each have a frustoconical upper portion 94, a central portion 95, a frustoconical lower portion 96, and a base portion 97. Each resting pin 92 extends vertically upward from the outer support ring 220. The shadow ring 70 includes support bores 76 adapted and positioned to mate with each of the resting pins 92. The support bores 76 extend vertically through the shadow ring 70 proximal the outer perimeter of the shadow ring 70. The upper portion 94 and the central portion 95 of the resting pins 92 have a diameter that is smaller than the diameter of the support bore 76; and the base portion 97 has a diameter that is larger than the diameter of the support bore 76. The lower portion 96 has a frustoconical shape that provides a smooth transition between the small diameter of the central portion 95 to the large diameter of the base portion 97. Accordingly, the diameter of the upper end of the lower portion 96 is the same as the diameter of the central portion 95 and the diameter of the lower end of the lower portion 96 is the same as the diameter of base portion 97. Because the size of the diameter of the support bore 76 is between the diameters of the central portion 95 and the base portion 97, when the support member 30 is in its first, lowered position, the support bores 76 engage the frustoconical lower portions 96 of the resting pins 92 intermediate the central portions 95 and the base portions 97 and the resting pins 92 support the shadow ring 70.

Due to the current demand for tighter tolerances and greater repeatability, the shadow ring 70 must be aligned relative to the support member 30 and the substrate 14. However, with prior designs, the lifting of the shadow ring 70 by the support member 30 may cause errors in the placement and alignment of the shadowing 70. The present invention addresses this problem by using the guide pins 50 to align the shadow ring 70 as the support member lifts the shadow ring 70. The shadow ring 70 includes at least one abutment surface 74 that is adapted and positioned to mate with and abut at least one of the guide pins 50 and, thereby, align the shadow ring 70 as the support member 30 moves from the first, lowered position to the second, raised position. Although the potential designs of abutment surfaces 74 are numerous, the preferred embodiment comprises a plurality of abutment surfaces 74, each of which mates with a corresponding guide pin 50. Each of the alignment bores 72 is in vertical alignment with a corresponding guide pin 50. The alignment bores 72 have a shape and size such that they can receive the corresponding guide pin 50 therein. A forward wall 73 of each alignment bore 72 serves as the abutment surface 74 and is slanted at substantially the same angle as the inner surface 52 of the corresponding guide pin 50 so that substantially the full surface area of the abutment surface 74 contacts the inner surface 52 during alignment. Thus, the lower ends of the abutment surfaces 74 are nearer one another than their upper ends.

Figure 3:
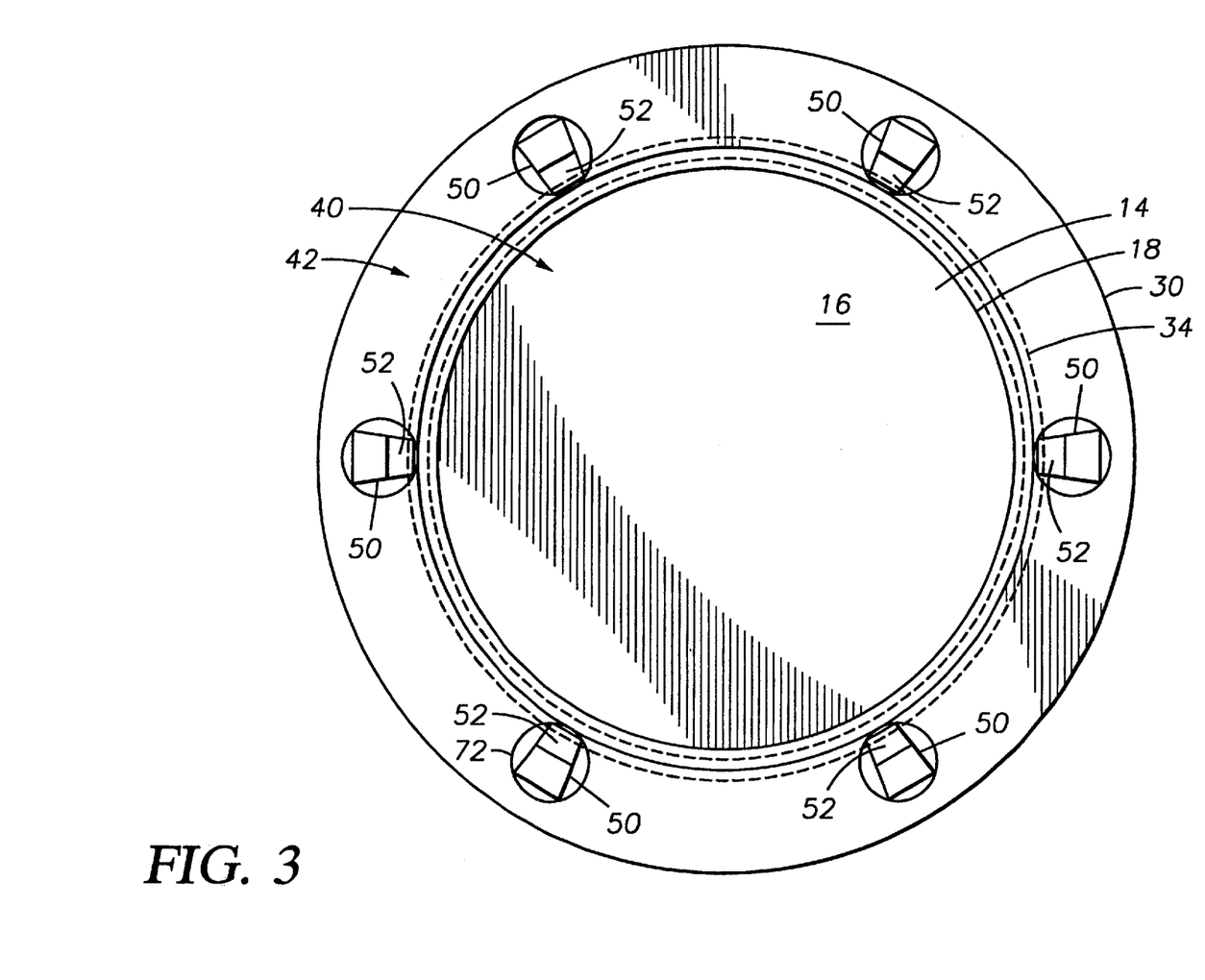
FIG. 3 is a top elevational view of the support member having a substrate thereon.

FIG. 3 is a top elevational view of the support member 30 having a substrate 14 supported thereon. As previously mentioned, alignment of the substrate 14 on the upper surface 32 of the support member 30 is crucial to maximizing the yield from the system 10. To facilitate this alignment, the support member 30 has a plurality of guide pins 50 coupled to its upper surface 32. The guide pins 50 are spaced about the upper surface 32 and are preferably equidistant from one another. The guide pins 50 are spaced in a circular pattern so that their inner surfaces 52 are sufficiently spaced at their lower ends to create a circular space therebetween that has a diameter that is substantially equal to the outer diameter of the substrate 14. Further, the inner surfaces 52 define a circular boundary to receive the substrate 14 therein that is substantially coextensive with the shape and size of the substrate 14. The inner surfaces 52 slant outwardly from one another so that the top ends of the inner surfaces 52 are further from one another than their bottom ends. The diameter of the circle formed by the inner surfaces 52 increases from a smallest diameter at the bottom of the inner surfaces 52 proximal the upper surface 32 of the support member 30 to a largest diameter at the top of the inner surfaces 52 distal the upper surface 32 of the support member 30. The inner surfaces 52 of the guide pins 50 form funnel for receiving and aligning the substrate 14 on the support member 30. Preferably, the alignment apparatus 20 includes at least six guide pins 50 spaced equally about the support member. The guide pins 50 extend partially over the continuous annular gas channel 34. Thus, as shown in FIG. 3, the substrate 14 resting on the upper surface 32 of the support member 30 hangs partially over the gas channel 34 about the full periphery of the substrate 14.

Figure 4:
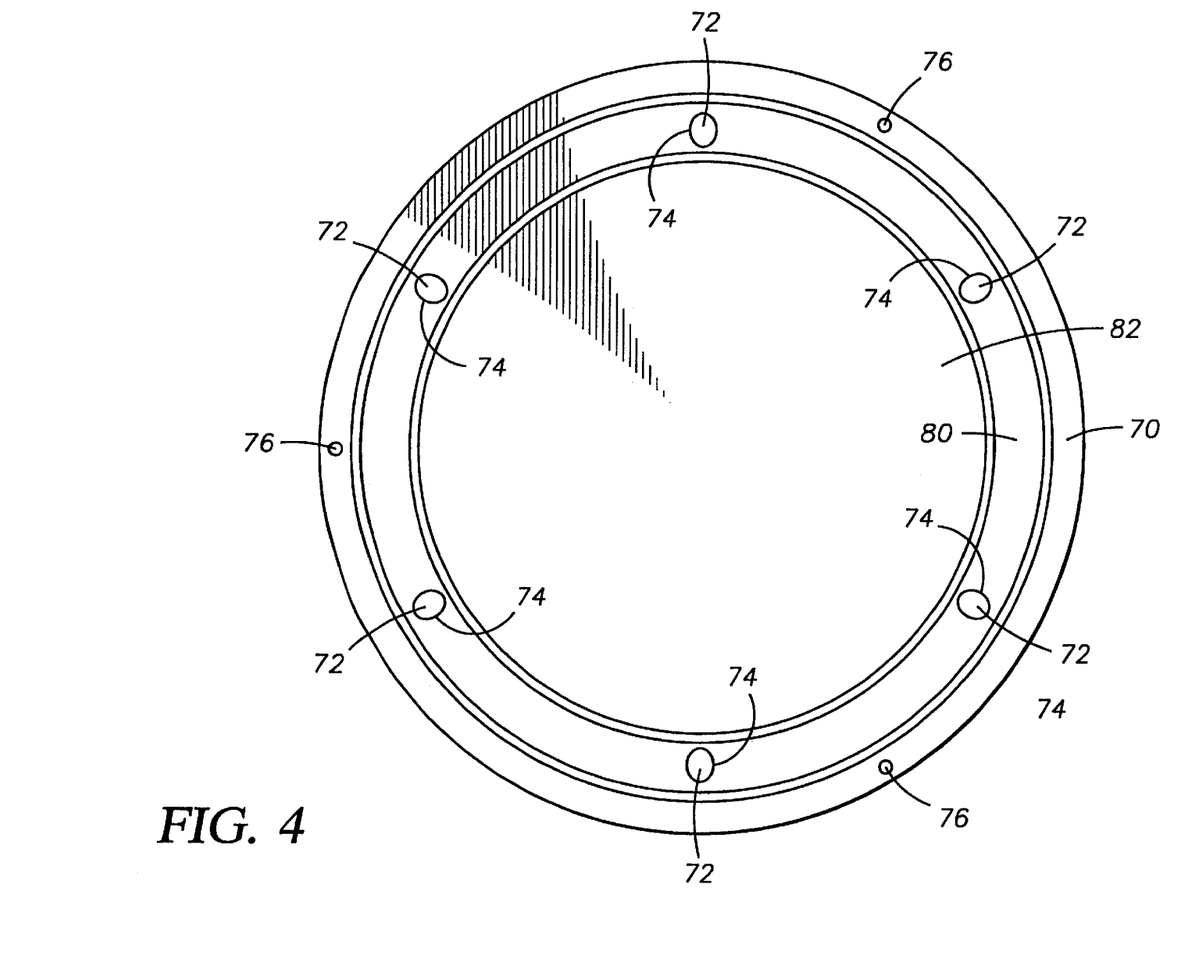
FIG. 4 is a top elevational view of the shadow ring.

FIG. 4 is a top elevational view of the shadow ring 70 showing the location of the aperture 82, the alignment bores 72, and the support bores 76. The shadow ring 70 preferably has an annular shape and defines a central, circular aperture 82 therethrough. Six alignment bores 72 are defined by and extend vertically through the shadow ring 70. The alignment bores 72 are disposed about the periphery of the aperture 82, are equally spaced from one another, and are positioned and adapted to mate with the guide pins 50 as previously discussed and as shown in FIG. 2. Likewise, the shadow ring 70 preferably includes three support bores 76 extending vertically therethrough that are equally spaced from one another. The support bores 76 are positioned and adapted to mate with the resting pins 92 as previously described and shown in FIG. 2.

Figure 5:
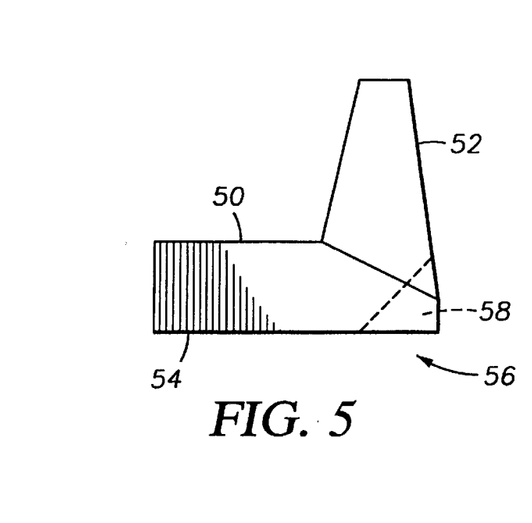
FIG. 5 is a side elevational view of the guide pin showing the slot.
Figure 6:
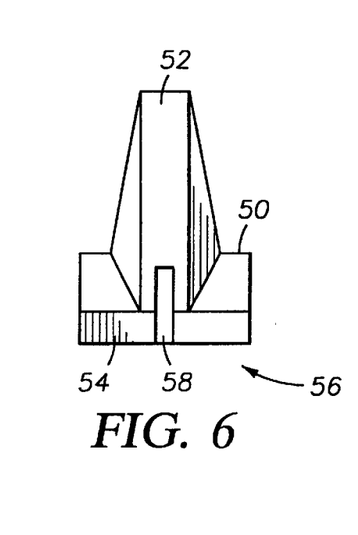
FIG. 6 is a front elevational view of the guide pin showing the slot.

FIGS. 5 and 6 are side and front elevational views of a guide pin 50, respectively. As shown in the figures, the guide pins 50 define a communication passageway 56 that extends therethrough and provides fluid communication of the purge gas therethrough. Preferably, the communication passageways 56 comprise a slot 58 formed in and defined by the guide pin 50. The slot 58 is open to both the inner surface 52 and the bottom 54 of the guide pin 50. Because the guide pin 50 overhangs the gas channel 34, the intersection of the slot 58 with the bottom 54 of the guide pin 50 provides fluid communication between the slot 58 and the gas channel 34 (shown in FIG. 2). The inner surface 52 of the guide pin 50 has a height that is greater than the thickness of the substrate 14 (shown in FIG. 2). Preferably, at the interface of the slot 58 and the inner surface 52, the slot extends from the bottom 54 to a position above the upper surface 32 of the substrate 14 (i.e., the height of the slot 58 is greater than the thickness of the substrate 14) so that the slot 58 directs the purge gas at the peripheral edge 18 of the substrate 14. The width of the slot 58 in the guide pin 50 is sufficiently wide that a guide pin 50 abutting the peripheral edge 18 of the substrate 14 does not substantially block the flow of purge gas to the peripheral edge 18 of the substrate 14.

Many alternative embodiments for the communication passageways 56 and the guide pins 50 are possible. For example, the sides of the slot 58 may flare outwardly toward the inner surface 52 to direct the purge gas at a wider area. Likewise, the outer sides of the guide pin 50 may angle inwardly near the inner surface 52 to facilitate flow around the guide pin 50. Alternatively, rather than simple slots, the communication passageways 56 may be one or more passageways through the guide pins 50 that direct the flow to specific areas at specific angles and at specific velocities (i.e. the passageways 56 may include small nozzles that accelerate the flow from the passageways 56). Further, the communication passageways 56, rather than providing passive flow from the gas groove, may be in fluid communication with separate purge gas feed lines allowing pressurized flow through and from the passageways 56.

Although the preferred embodiments for the various components of the present invention including the alignment apparatus 20 and the hanger member 90 are described above, many alternative embodiments for the components are possible. Examples of possible alternative embodiments are shown in FIGS. 7 through 11 and a description of each of these figures follows.

Figure 7:
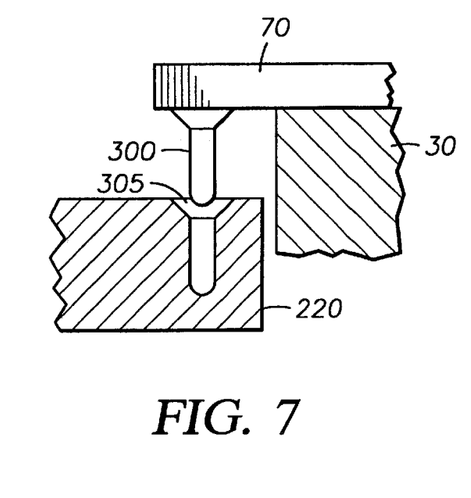
FIG. 7 is a cross sectional, side elevational view of an alternative embodiment for the hanger member.

In the alternative embodiment for the hanger member 90 shown in FIG. 7, hanger member 90 includes a centering pin 300 and a centering bore 305. The centering pin 300 is attached to the shadow ring 70 and extends vertically downward therefrom and mates with the centering bore 305 formed in the outer support ring 220. The centering pin has a frustoconical portion that urges the shadow ring 70 into alignment during each processing cycle when the support member 30 returns to the first position. The centering pin 300 remains in the centering bore 305 at all times preventing rotation of the shadow ring 70.

Figure 8:
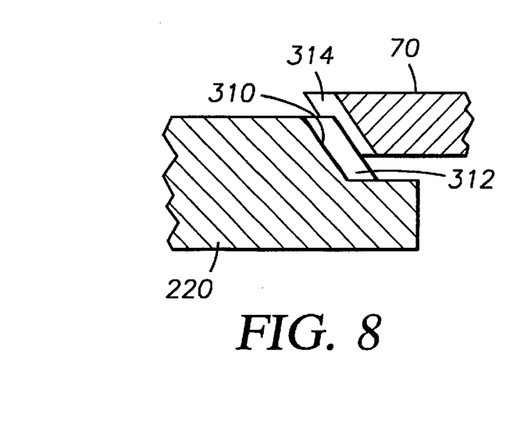
FIG. 8 is a cross sectional, side elevational view of a second alternative embodiment for the hanger member.
Figure 9:
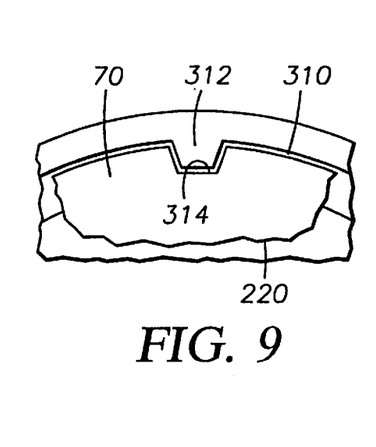
FIG. 9 is a partial top elevational view of the second alternative embodiment for the hanger 1 member shown in FIG. 9.

FIGS. 8 and 9 show a cross sectional side and top elevational view of a second alternative embodiment for the hanger member 90, respectively. As shown in the figures, the alignment of the shadow ring 70 between processing cycles in the second alternative embodiment is accomplished using a centering ramp 310 formed in the outer support ring 220. Essentially, the centering ramp 310 is a recess in the support ring 220 having slanted sides that form a funnel for receiving the shadow ring 70. The funnel formed by the centering ramp 310 has an upper diameter greater than the diameter of the shadow ring 70 and a lower diameter that is smaller than the shadow ring 70 so that, as the support member 30 returns to the first position, the edge of the shadow ring 70, which may also be angled, engages the centering ramp 310 which forces the shadow ring 70 into a reset position. A centering detent 312 extending inwardly from the centering ramp 310 mates with a centering notch 314 formed in the edge of the shadow ring 70. The centering detent 312 and centering notch 314 combine to prevent the relative rotation of the shadow ring 70 and to reset its rotational position after each processing cycle.

Figure 10:
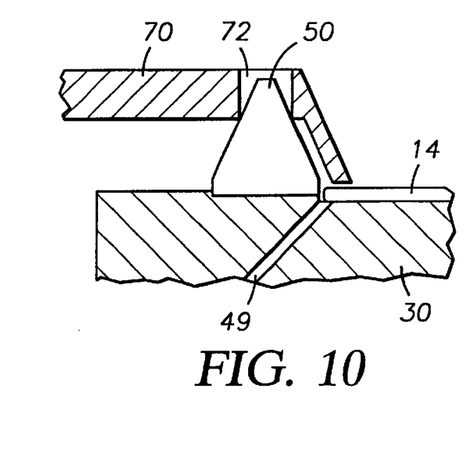
FIG. 10 is a cross sectional, side elevational view of an alternative embodiment of the shadow ring alignment mechanism.

FIG. 10 discloses one possible alternative embodiment for aligning the shadow ring 70 relative to the substrate 14 and the support member 30. Rather than using a single abutment surface 74 as in the preferred embodiment (shown in FIG. 2), the alternative embodiment uses a guide pin 50 that has a frustoconical shape that narrows toward its upper end. The alignment bore 72 is circular having a diameter that is intermediate the diameter of the upper end and lower end of the frustoconical guide pin 50. Accordingly, as the support member 30 rises, the upper end of the frustoconical guide pin 50 enters the circular support bore 76 forcing the shadow ring 70 laterally into alignment.

Figure 11:
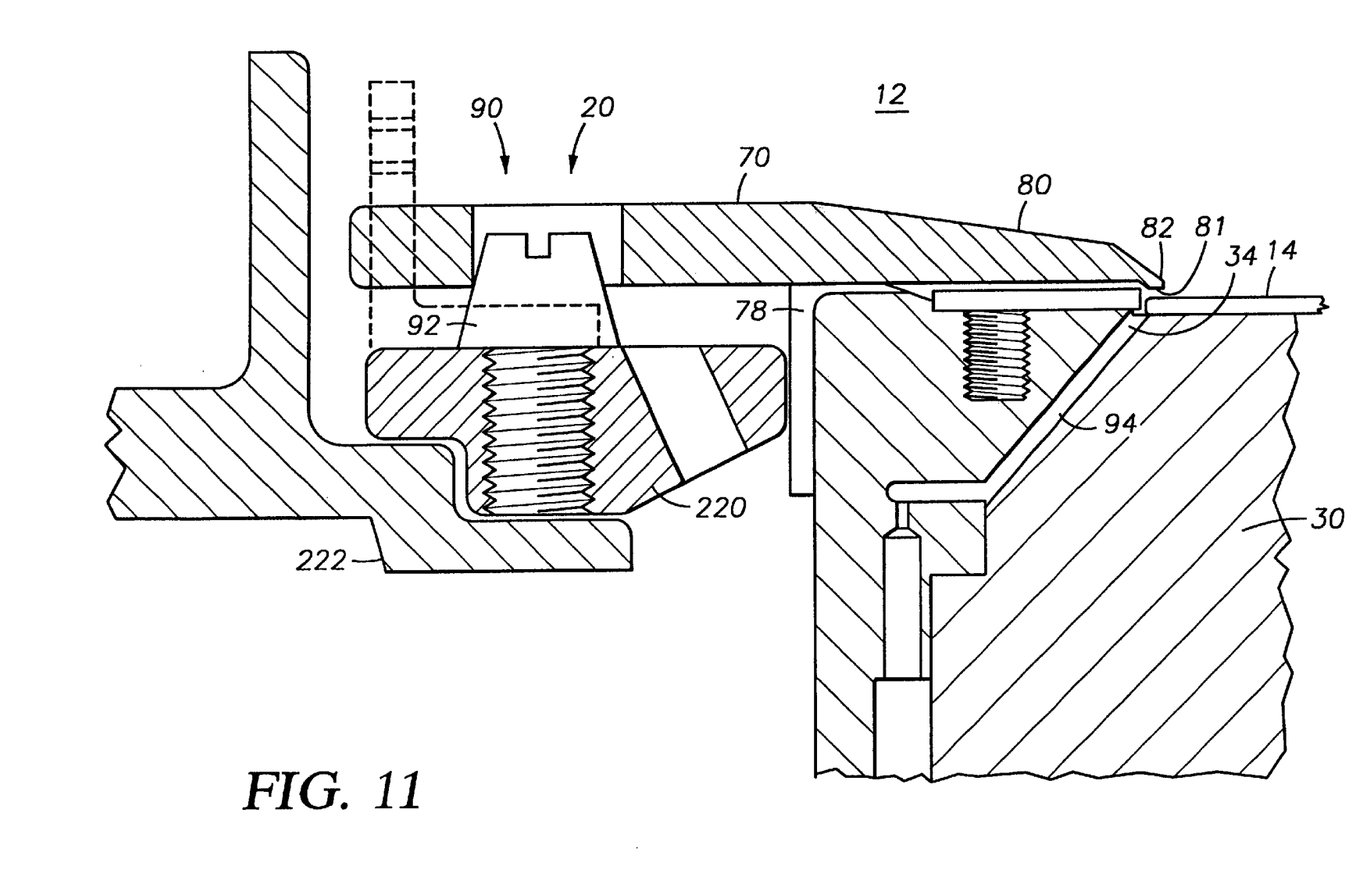
FIG. 11 is a partial cross sectional, side elevational view of an alternative embodiment of the alignment apparatus.

FIG. 11 is a cross sectional side elevational view of an alternative embodiment of the hanger member 90. As shown in FIG. 11, the resting pin 92 has a frustoconical shape along its full length rather than the multiple portion design of the preferred embodiment. The spacer support 78 is coupled to the support member 30 rather than to the shadow ring 70.

In another alternative embodiment (not shown) the circular support bores 76 in the shadow ring 70 may be replaced with slots that extend to the edge of the shadow ring 70.

FIG. 11 also shows a shadow ring 70 and process chamber component design that have been optimized so that the process chamber 12 can meet the industry standards for edge exclusion and film deposition. With the support member 30 in the second position, the upper shield portion 80 of the shadow ring 70 extends downward so that the area near the aperture 82 is maintained near the periphery of the substrate 14. This inner area forms a mask area 81 of the shadow ring 70 which is the area of the shadow ring 70 that overhangs the substrate 14. Through empirical analysis, the optimum construction for the shadow ring 70 has been discovered that can be used to meet the above described industry requirements. Accordingly, in the preferred optimized embodiment, the shadow ring mask area 81 has a width of about 1.5 mm and is maintained above the surface of the substrate 14 about 0.3 mm. A purge gas flow rate of about 1200 sccm has been shown to exceed the industry standards and produces a film thickness at about 2 mm from the edge of the substrate 14 that is ninety percent of the film thickness at the center of the substrate 14.

Figure 12:
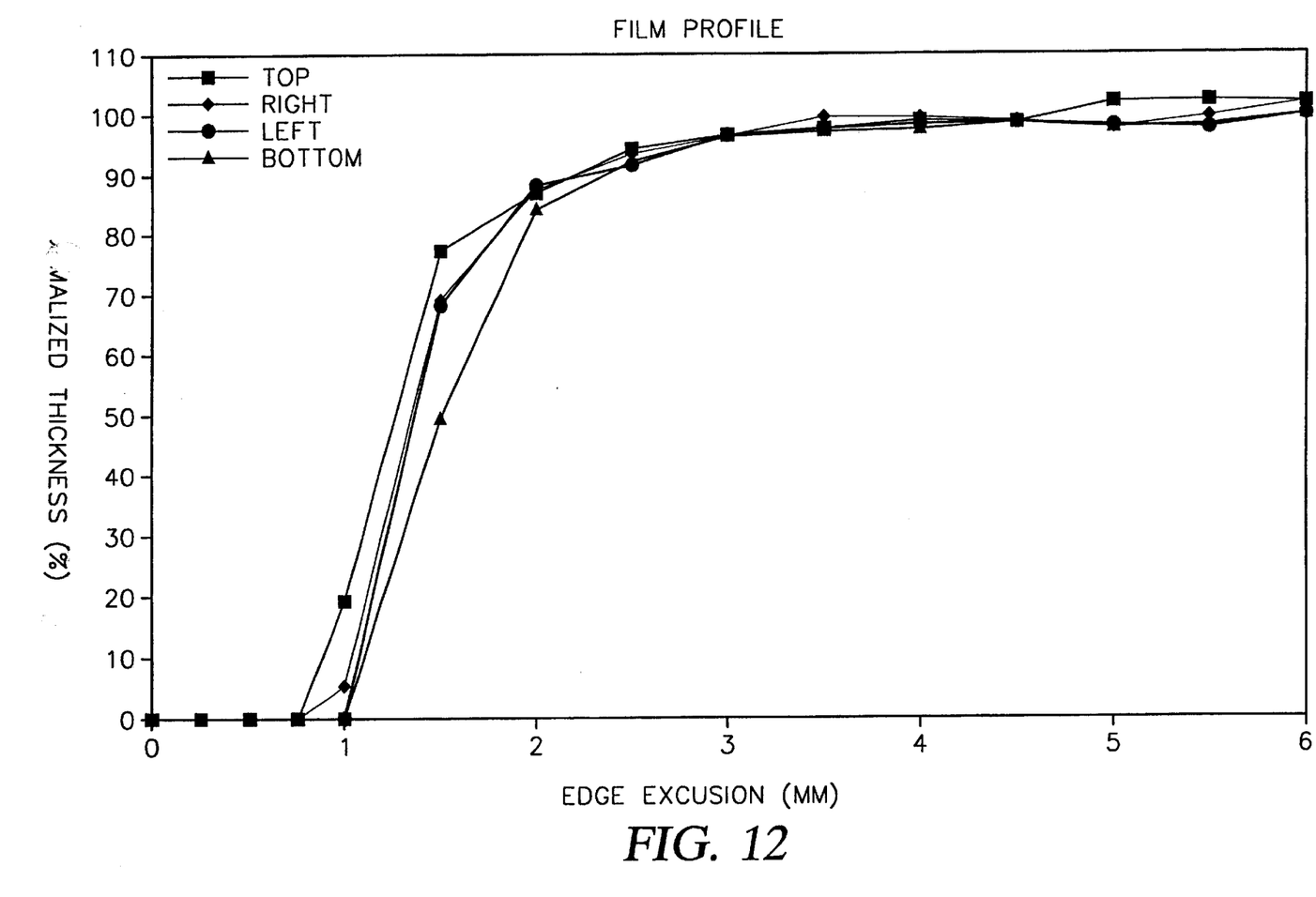
FIG. 12 shows a graphical representation of film thickness versus edge exclusion using the invention.

This optimized construction was tested using the above described mask area 81 having a width of about 1.5 mm, a distance between the shadow ring 70 and the substrate 14 of about 0.3 mm, and a purge gas flow rate of about 1200 sccm combined with accurate alignment of the substrate 14 and the shadow ring 70 relative to the support member 30 and one another. After testing, the film profile was checked at four positions around the substrate 14 offset by about ninety degrees from one another. The resulting film formed on the substrate 14 had very steep edges and reached the desired 90 percent film thickness at about 2 mm from the edge 18 of the substrate 14. This film thickness was substantially constant at all four measured positions. A graphical representation of the testing results are shown in FIG. 12, wherein the x-axis provides the normalized film thickness and the y-axis shows the edge exclusion in millimeters.

As mentioned, the present invention is particularly useful in chemical vapor deposition systems 10 which include the process chamber 12 and the additional components described above.

METHOD OF OPERATION

In operation, the substrate 14 is placed onto the upper surface 32 of the support member 30 as follows. The robot arm inserts the substrate 14 into the process chamber 12 through the slit valve opening 210 supporting the substrate vertically above the support member 30. The secondary motion actuator 202 raises the lifting fingers 200, which extend through finger apertures in the support member 30, into contact with the substrate 14 and lifts the substrate 14 from the robot arm supporting the substrate 14 intermediate the first and second positions of the support member 30. The robot arm is then retracted from the process chamber 12. Next, the motion actuator (not shown) lifts the support member 30 from the first position, past the top of the lifting fingers 200, to the second position. This motion of the support member 30 lifts the substrate 14 from the lifting fingers 200. Performing these steps in reverse order operates to complete a transfer of the substrate 14 from the support member 30 to the robot arm and from the process chamber 12.

As the support member 30 moves from the first position past the upper ends of the lifting fingers 200 to receive the substrate 14 thereon, any misalignment of the substrate relative to the support member 30 is corrected by the inner angled surface 52 of the guide pins 50. If the substrate 14 is misaligned, the substrate contacts one or more of the guide pins 50, particularly their inner surfaces 52, intermediate the top and bottom ends of the guide pins 50. After the substrate 14 contacts the guide pins 50 and as the support member 30 continues to rise to the second position, the slanted inner surfaces 52 of the guide pins 50 apply a lateral force on the peripheral edge 18 of the substrate 14 and force the substrate 14 into alignment with the support member 30. The inner surfaces 52 are relatively smooth so that the substrate 14 may slide along the inner surfaces 52 and any frictional forces between the substrate 14 and the guide pins 50 are minimized, thereby reducing potential particle generation caused by the contact therebetween and minimizing any lifting force applied to the substrate 14 by the guide pin 50. Once the support member 30 has been raised sufficiently to receive the substrate on its upper surface 32, the guide pins 50 will have urged the substrate 14 to a lateral position within the smallest diameter of the inner surfaces 52 and into alignment with the support member 30. The proper alignment corresponds with the circular diameter formed at the lower ends of the guide pins 50. The height of the guide pins 50 and the angle of their inner surface 52 are sufficient that the largest diameter formed by the guide pins 50, at their upper end, is large enough to account for a substantial misalignment of the substrate 14 which will allow the guide pins 50 to capture and align all of the substrates 14 inserted into the process chamber 12. So that they force the substrate 14 partially over the gas channel 34, the guide pins extend partially over the gas channel 34. This ensures proper alignment of the substrates 14 relative to the gas channel 34 and ensures that the purge gas flows about the full periphery of the substrate 14.

When the support member 30 is in the first lowered position, the shadow ring 70 is supported above the support member 30 by the hanger member 90. More particularly, the shadow ring 70 is positioned in the process chamber 12 so that the resting pins 92, which extend vertically upward from the outer support ring 220, extend through the support bores 76 in the shadow ring 70. The shadow ring 70 rests on the frustoconical lower portions 96 of the resting pins 92. As the support member 30 moves from the first position to the second, raised position, the upper surface 32 of the support member 30 contacts the spacer support 78 of the shadow ring 70 which has a smaller diameter than the outer diameter of the support member 30, and therefore extends over the support member 30, and lifts the shadow ring 70 vertically with the support member 30. Because the central portions 95 of the resting pins 92 have smaller diameters than the diameters of the support bore 76, the shadow ring 70 slides freely on the resting pins 92 when lifted above the frustoconical lower portion 96.

After processing of the substrate 14, the support member 30 returns from the second position to the first position. During this downward motion, the shadow ring 70 moves downward with the support member 30 until the support bores 76 encounter the lower portions 96 of the resting pins 92 and the diameter of the lower portions 96 equal the diameter of the support bores 76. At that point, the resting pins 92 support the shadow ring 70 while the support member 30 continues its downward movement to the first position. The frustoconical shape of the lower portions 96 forces the shadow ring 70 into the same position each time the support member 30 returns to the first position between processing cycles in which a substrate 14 is processed in the process chamber 12. Consequently, between the processing of each substrate 14, the shadow ring position is reset relative to the support member 30, thereby increasing repeatability of shadow ring positioning. This recentering is also important during maintenance cycles when the system 10 is shut down. When the system 10 is restarted, the relative position of the shadow ring 70 to the support member 30 is automatically properly set. Additionally, because the resting pins 92 remain in the support bores 76 at all times during the movement of the shadow ring 70, the shadow ring cannot rotate, for example, due to vibration.

In order to meet the industry's edge exclusion requirements, the shadow ring 70 must be aligned relative to the substrate 14 and the support member 30 during processing of the substrate 14. As the support member 30 moves from the first position to the second position, the guide pins 50 extending upwardly from the upper surface 32 enter the corresponding alignment bores 72 of the shadow ring 70. The inner surfaces 52 of the guide pins 50 mate with and abut the abutment surfaces 74 formed by the forward wall 73 of the alignment bores 72. Continued upward movement of the support member 30 lifts the shadow ring 70 from the lower portion 96 of the resting pins 72 allowing the corresponding angled surfaces (i.e. the abutment surface 74 and the inner surface 52) to exert a lateral sliding force on the shadow ring 70 causing lateral alignment of the shadow ring 70. The guide pins 50, therefore, align the shadow ring 70 relative to the support member 30 and the substrate 14 creating a more reliable and repeatable system.

By covering the outer periphery of the substrate 14, the shadow ring 70 helps prevent unwanted deposition of material on the exclusionary zone of the upper surface 16 of the substrate 14 which includes the beveled edges of the substrate 14. Although the shadow ring 70 is effective at preventing such deposition, a more effective system also incorporates the use of a purge gas directed about the periphery of the substrate 14 which flows around the peripheral edge 18 of the substrate 14 and over its upper surface 16 proximal the periphery. A purge gas line 48 (not shown) is present in the support member 30. A purge gas, such as argon, is passed into a plurality of purge gas openings 49 in the support member 30 that direct the purge gas to a gas channel 34, which is preferably in the form of a continuous annular gas groove formed in the upper surface 32 of the support member 30. Because the guide pins 50 partially overhang the gas channel 34, they force the substrate 14 into a position wherein the substrate 14 partially overhangs the gas channel 34 about the full periphery of the substrate 14. The shadow ring 70 which is supported slightly above the upper surface 16 by the spacer support 78. Thus, the purge gas flows from the gas channel 34 to the edge 18 of the substrate 14 and over the upper surface 16 of the substrate 14 between the upper surface 16 and the overhanging shadow ring 70.

When the guide pins 50 force the substrate 14 into alignment, they necessarily contact the substrate 14. Thus, the guide pins include the communication passageways 56 to provide fluid communication for the purge gas from the gas channel 34 to a position at or above the upper surface 16 of the substrate 14 and preferably to the peripheral edge 18 of the substrate 14. The flow of purge gas is directed between the shadow ring 70 and the substrate 14 and at the edge 18 of the substrate 14. Thereby, the purge gas is able to effectively prevent the process gas from contacting the exclusionary zone of the substrate 14, even near the guide pins 50, and prevent the process gas from depositing material in the exclusionary zone.

While the foregoing is directed to the preferred embodiment of the present invention, other and further embodiments of the invention may be devised without departing from the basic scope thereof, and the scope thereof is determinedly the claims which follow.

What is claimed is:

1. An apparatus, comprising:

shadow ring defining at least one support bore for receiving at least one resting pin and a plurality of guide pin bores for receiving a plurality of guide pins;

a hanger member comprising the at least one resting pin and adapted to support the shadow ring and reset the position of the shadow ring relative to the support member when the shadow ring is supported on the hanger member;

a support member comprising the plurality of guide pins; wherein the support member is movable vertically between a first position and a second position;

so that, in the first position of the support member, the shadow ring is supported by the hanger member and the at least one resting pin is disposed in the at least one support bore; and so that, in the second position of the support member, the shadow ring covers an outer peripheral portion of a substrate and the plurality of guide pins are disposed in the plurality of guide pin bores.

2. The apparatus of claim 1, wherein the hanger member comprises a support ring having the at least one resting pin disposed thereon.

3. The apparatus of claim 1, wherein the hanger member comprises three resting pins.

4. The apparatus of claim 1, further comprising:

a gas channel annularly disposed in the support member, wherein the plurality of guide pins are disposed about a periphery of the gas channel and at least partially over the gas channel and having an inner surface that together define a circumferential boundary to receive the substrate therein.

5. The apparatus of claim 1, further comprising a chemical vapor deposition chamber having the shadow ring, the hanger member and the support member disposed therein.

6. The apparatus of claim 1, wherein the at least one resting pin comprises:

an upper portion, a central portion, a lower portion, and a base portion;

the central portion having a diameter that is less than the diameter of the corresponding of the at least one support bore;

the base portion having a diameter that is greater than the diameter of the corresponding of the at least one support bore; and the lower portion having a frustoconical shape and a diameter that increases from its smaller end proximal the central portion to its larger end proximal the base portion.

7. The apparatus of claim 6, wherein:

and the smaller diameter of the lower portion is equal to the diameter of the central portion and the larger diameter of the lower portion is equal to the diameter of the base portion;

so that the lower portion provides a smooth transition from the smaller diameter central portion to the larger diameter base portion.

8. The apparatus of claim 6, wherein the shadow ring rests on the lower portions of the one or more resting pins when the support member is in the first position.

9. An apparatus comprising:

a shadow ring;

a hanger member adapted to support the shadow ring and reset the position of the shadow ring relative to the support member when the shadow ring is supported on the hanger member;

a support member defining a gas channel annularly disposed therein; wherein the support member is movable vertically between a first position and a second position so that, in the first position, the shadow ring is supported by the hanger member, and so that, in the second position, the shadow ring covers an outer peripheral portion of a substrate; and a plurality of guide pins disposed on the support member and spaced about a periphery of the gas channel, the plurality of guide pins disposed at least partially over the gas channel and having an inner surface that together define a circumferential boundary to receive the substrate therein.

10. The apparatus of claim 9, wherein the shadow ring defines guide pin bores sized to receive the plurality of guide pins.

11. The apparatus of claim 9, wherein, when the support member is in the second position, the shadow ring is maintained about 0.3 mm above the upper surface of the substrate.

12. The apparatus of claim 9, wherein the shadow ring comprises a shield portion defining an aperture therethrough; wherein a diameter of the aperture is less than the diameter of a substrate disposed on an upper surface of the support member so that the shield portion overhangs a periphery of the substrate.

13. The apparatus of claim 9, wherein each of the plurality of guide pins define a gas groove formed in the inner surface, wherein the gas groove is in fluid communication with the gas channel.

14. The apparatus of claim 9, wherein the hanger member comprises:

a support ring; and one or more resting pins extending from the support ring and registered with one or more support bores defined by the shadow ring; the one or more support bores and the one or more resting pins adapted to allow relative movement of the one or more resting pins through the one or more support bores.

15. The apparatus of claim 14, further comprising:

each of the one or more resting pins having an upper portion, a central portion, a lower portion, and a base portion;

the central portion having a diameter that is less than the diameter of the corresponding of the one or more support bores;

the base portion having a diameter that is greater than the diameter of the corresponding of the one or more support bores; and the lower portion having a frustoconical shape and a diameter that increases from its smaller end proximal the central portion to its larger end proximal the base portion.

16. The apparatus of claim 14, wherein the shadow ring defines guide pin bores sized to receive the plurality of guide pins.

* * * * *

UNITED STATES PATENT AND TRADEMARK OFFICE
CERTIFICATE OF CORRECTION

PATENT NO. : 6,328,808 B1  
DATED : December 11, 2001  
INVENTOR(S) : Kenneth Tsai et al.

It is certified that error appears in the above-identified patent and that said Letters Patent is hereby corrected as shown below:

Column 5,
Line 63, delete the "1" after "hanger".

Column 7,
Line 57, please change "diameter of the of the" to -- diameter of the --.
Line 63, please change "0.3 mnm," to -- 0.3 mm, --.

Column 14,
Line 10, please change "determinedly" to -- determined by --.
Line 64, please delete "and" before "the smaller diameter".

Signed and Sealed this

Thirty-first Day of December, 2002

JAMES E. ROGAN  
*Director of the United States Patent and Trademark Office*